(12) United States Patent
Galler et al.

(10) Patent No.: US 10,568,210 B2
(45) Date of Patent: Feb. 18, 2020

(54) ELECTRONIC DEVICE WITH EMBEDDED ELECTRONIC COMPONENT

(71) Applicant: AT & S Austria Technologie & Systemtechnik Aktiengesellschaft, Leoben (AT)

(72) Inventors: Christian Galler, Leoben (AT); Gerhard Stubenberger, Trofaiach (AT); Markus Leitgeb, Trofaiach (AT); Wolfgang Schrittwieser, Kapfenberg (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/757,168

(22) PCT Filed: Sep. 1, 2016

(86) PCT No.: PCT/EP2016/070670
§ 371 (c)(1),
(2) Date: Mar. 2, 2018

(87) PCT Pub. No.: WO2017/037206
PCT Pub. Date: Mar. 9, 2017

(65) Prior Publication Data
US 2018/0279479 A1    Sep. 27, 2018

(30) Foreign Application Priority Data
Sep. 2, 2015 (DE) .......... 10 2015 114 682

(51) Int. Cl.
*H05K 1/18* (2006.01)
*H01L 23/13* (2006.01)
*H01L 21/56* (2006.01)
*H01L 23/00* (2006.01)
(Continued)

(52) U.S. Cl.
CPC ............. *H05K 1/188* (2013.01); *H01L 21/56* (2013.01); *H01L 23/13* (2013.01); *H01L 24/00* (2013.01);
(Continued)

(58) Field of Classification Search
USPC ......................................................... 361/762
See application file for complete search history.

(56) References Cited

U.S. PATENT DOCUMENTS 8,230,590 B2   7/2012  Nishimura et al.
8,653,674 B1   2/2014  Darveaux et al.
(Continued)

FOREIGN PATENT DOCUMENTS

DE          42 42 408 C2    2/1998
DE    10 2005 032 489 B3   11/2006
(Continued)

*Primary Examiner* — Andargie M Alychillhum
(74) *Attorney, Agent, or Firm* — Robert A. Blaha; Smith Tempel Blaha LLC

(57) ABSTRACT

An electronic device includes a component carrier with a component carrier body, an electrically conductive layer, and an adhesive structure. The electronic device further includes an electronic component which is arranged within the component carrier body. The adhesive structure is formed between a surface of the electronic component and the electrically conductive layer and covers only a part of the surface of the electronic component. A remaining part of the surface of the electronic component is covered with the component carrier body.

17 Claims, 4 Drawing Sheets

(51) Int. Cl.
*H05K 3/30* (2006.01)
*H01L 23/538* (2006.01)
*H01L 23/31* (2006.01)

(52) U.S. Cl.
CPC ............ *H05K 3/30* (2013.01); *H01L 23/3107* (2013.01); *H01L 23/5386* (2013.01); *H01L 23/5389* (2013.01); *H01L 2224/18* (2013.01); *H01L 2924/14* (2013.01); *H01L 2924/181* (2013.01); *H05K 2201/0195* (2013.01); *H05K 2201/09509* (2013.01); *H05K 2203/1469* (2013.01)

(56) References Cited

U.S. PATENT DOCUMENTS

| | | |
|---|---|---|
| 8,704,359 B2 | 4/2014 | Tuominen et al. |
| 2008/0164601 A1* | 7/2008 | Lin .......................... H01L 23/13 257/693 |
| 2008/0318055 A1 | 12/2008 | Fillion et al. |
| 2009/0277673 A1 | 11/2009 | Sohn et al. |
| 2010/0212946 A1* | 8/2010 | Shimizu .............. H01L 23/5384 174/261 |
| 2017/0181293 A1* | 6/2017 | Weidinger ............. H05K 1/185 |

FOREIGN PATENT DOCUMENTS

| | | |
|---|---|---|
| DE | 10 2007 010 731 A1 | 8/2008 |
| DE | 10 2011 003 852 A1 | 8/2012 |
| EP | 2 592 126 A1 | 5/2013 |
| WO | WO 2014052051 A2 | 4/2014 |
| WO | WO 2015000007 A1 | 1/2015 |

\* cited by examiner

Table 1. IPC/JEDEC J-STD-20 MSL Classifications

| | | | Soak Requirements | | | |
|---|---|---|---|---|---|---|
| | Floor Life | | Standard | | Accelerated | |
| Level | Time | Cond degC/%RH | Time (hrs) | Cond degC/%RH | Time (hrs) | Cond degC/%RH |
| 1 | unlimited | <=30/85% | 168+5/-0 | 85/85 | n/a | n/a |
| 2 | 1 year | <=30/60% | 168+5/-0 | 85/60 | n/a | n/a |
| 2a | 4 weeks | <=30/60% | 696+5/-0 | 30/60 | 120+1/-0 | 60/60 |
| 3 | 168 hours | <=30/60% | 192+5/-0 | 30/60 | 40+1/-0 | 60/60 |
| 4 | 72 hours | <=30/60% | 96+2/-0 | 30/60 | 20+0.5/-0 | 60/60 |
| 5 | 48 hours | <=30/60% | 72+2/-0 | 30/60 | 15+0.5/-0 | 60/60 |
| 5a | 24 hours | <=30/60% | 48+2/-0 | 30/60 | 10+0.5/-0 | 60/60 |
| 6 | TOL | <=30/60% | TOL | 30/60 | n/a | 60/60 |

ELECTRONIC DEVICE WITH EMBEDDED ELECTRONIC COMPONENT

CROSS-REFERENCE TO RELATED APPLICATIONS

This application is the U.S. national phase of International Application No. PCT/EP2016/070670, filed Sep. 1, 2016, which designated the U.S. and claims priority to German Patent Application No. 10 2015 114 682.7, filed Sep. 2, 2015, the disclosures of which are hereby incorporated herein by reference in their entirety.

TECHNICAL FIELD

The invention relates to an electronic device and a method of manufacturing an electronic device.

TECHNOLOGICAL BACKGROUND

Conventionally, component carriers as printed circuit boards (PCB) are equipped with electronic components by applying an adhesive material on a surface of the component carrier, subsequently placing the electronic component on the adhesive material and fixing the electronic component to the component carrier by curing the adhesive material. Typically, the adhesive material covers a whole surface of the electronic component, e.g. a lower surface of the electronic component. Thereby, a huge amount of adhesive material is required. Further, this conventional adhesion technique leads to a shape of the applied adhesive material which has the form of a crater which has an air filled gap between the adhesive material and the electronic component. In subsequent manufacturing steps, e.g. embedding the electronic component, high temperature and pressure is applied to the component carrier. Meanwhile, the undesired air filled gap may lead to pressure applied to the electronic component, to internal stress within the component carrier, to delamination of the component carrier or to damage of the electronic component. In addition, the comparatively huge amount of adhesive material may lead to a high humidity absorbed by the adhesive material, thereby further increasing the risk of delamination.

FIG. 1 shows a conventional electronic device 100. A conventional electronic component 150 is embedded within a conventional component carrier which comprises a conventional component carrier body 110, a conventional electrically conductive layer 120, and a conventional adhesive structure 130. A lower surface and lateral surfaces of the conventional electronic component 150 are entirely covered with the conventional adhesive structure 130. As can be seen from the FIG. 1, the conventional adhesive structure 130 extends beyond the edges of the conventional electronic component 150 and forms an overlap of conventional adhesive material, a so-called meniscus 130-1. The meniscus 130-1 acts like a small ramp on which further layers might slip, thereby may impede the registration. Further, the meniscus 130-1 may hinder an arrangement of an adjacent electronic component close to the conventional electronic component 150.

EP 2 592 126 A1 discloses in FIG. 1 a semiconductor device with a semiconductor chip 100 and a further semiconductor chip 104 which is attached to the semiconductor chip 100 using an adhesive layer 102. The adhesive layer covers the surface of both semiconductor chips only partially. A space between the parts of adhesive is filled with gold pads 103 and gold stud bumps 101.

U.S. Pat. No. 8,704,359 B discloses an electronic module in which a component is glued to the surface of a conductive layer. FIG. 8 shows the component 6 which is glued to the copper layer 4 with an adhesive 5. The adhesive 5 covers the component 6 only partially, since holes 17 are formed in the adhesive 5 as feed-throughs for an electrical connection of the component 6. Subsequently, the holes 17 are plated with copper.

SUMMARY

There may be a need to provide an electronic device with an improved robustness.

In order to achieve improved robustness, an electronic device and a method of manufacturing an electronic device according to the independent claims are provided.

According to an exemplary embodiment of the invention, an electronic device is provided which comprises a component carrier with a component carrier body, an electrically conductive layer, and an adhesive structure. The electronic device further comprises an electronic component which is arranged within the component carrier body. The adhesive structure is formed between an (adhesion) surface of the electronic component and the electrically conductive layer, wherein the adhesive structure covers only a first part of the surface of the electronic component, and wherein a remaining second part of the surface of the electronic component is covered with the component carrier body.

In particular, the surface of the electronic component, for example a lower surface of the electronic component, is covered partially with the adhesive structure which fixes the electronic component to an electrically conductive layer, e.g. to a copper foil. The surface may be the surface of the electronic component which is arranged and located vis-à-vis to the electrically conductive layer. For example, the surface of the electronic component is arranged within a planar plane. A remaining part of the (e.g. lower) surface of the electronic component, which is not covered with the adhesive structure, is covered with material from the component carrier body, e.g. with resin. The adhesive structure may be a layer of a dielectric adhesive material. Additionally or alternatively, the adhesive structure may also comprise an electrically conductive adhesive material.

According to another exemplary embodiment of the invention, a method of manufacturing an electronic device is provided. The method comprises the steps of providing a component carrier comprising a component carrier body, an electrically conductive layer and an adhesive layer. The method further comprises applying the adhesive structure on the electrically conductive layer, and equipping the component carrier with an electronic component by placing the electronic component on the adhesive structure, such that the adhesive structure covers only a first part of the surface of the electronic component. The method further comprises embedding the electronic component within the component carrier body by laminating an electrically insulating structure of the component carrier body onto the electronic component, such that a remaining second part of the surface of the electronic component is covered with the component carrier body.

In particular, a copper foil as electrically conductive layer with registration marks may be provided. It is to be understood by those skilled in the art, that the electrically conductive layer alternatively may be a resin coated copper (RCC) layer or foil as well as any other suitable electrically conductive layer structure without extending beyond the scope of the invention. As a subsequent step, an adhesive structure is printed, injected or dispensed onto the copper foil using the registration marks for an exact alignment. In the next step, the electronic component is placed on the adhesive structure, such that the electronic component laterally extends beyond the adhesive structure in at least one direction. I.e., at that time a free space remains between a portion of the electronic component and the copper foil, which is not filled with adhesive material. In a subsequent step, the adhesive structure may be cured, thereby fixing the electronic component to the component carrier. In a further step, the electronic component is embedded by laminating a prepreg as electrically insulating structure onto the electronic component. Laminating is carried out by applying heat and pressure to the component carrier. Thereby, the free space between the portion of the electronic component and the copper foil may be filled with resin from the prepreg.

OVERVIEW OF EMBODIMENTS

In the context of the present application, the term "substantially fully circumferentially enclosing" may particularly denote that at least a major portion of the circumference of the component is contacted by or arranged directly next to a respective portion of the auxiliary structure. For example, at least 90% of the circumference of the component may be enclosed by material of the auxiliary structure. This can be accomplished for example by an integrally formed frame-shaped transition piece of the auxiliary structure, by a transition piece composed of multiple individual bodies put together to form a surrounding, or by a for instance granulate-type material arranged around the component as auxiliary structure. Hence, the presence of one or more small gaps around the perimeter of the component in which no material of the auxiliary structure is present, shall not be excluded by the term "substantially fully circumferentially enclosing". However, it is in particular possible that the transition piece fully circumferentially encloses the component or is adapted therefore.

In the context of the present application, the term "component carrier" may particularly denote any support structure which is capable of accommodating one or more electronic components thereon and/or therein for providing both mechanical support and electrical connectivity.

In the context of the present application, the term "component carrier body" may particularly denote any support structure which may consist exclusively of electrically insulating material, e.g. a so-called prepreg or FR4 material with resin and/or glass fibers. Alternatively, the component carrier body may comprise a layer stack of (e.g. alternating) layers of at least one electrically insulating layer and at least one electrically conductive layer, e.g. a copper foil covered with prepreg.

In the context of the present application, the term "surface of the electronic component" may particularly denote a surface which is arranged and located vis-à-vis to the electrically conductive layer. For example, the surface of the electronic component is arranged within a planar plane. The first part of the surface of the electronic component is intended to be in direct contact with the adhesive structure. The area, i.e. the first part, of the surface may constitute e.g. 50% of the respective entire surface of the electronic component. In particular, the first part of the surface may constitute less than 20% of the respective entire surface of the electronic component, more particularly less than 10% of the respective entire surface of the electronic component. In this context, the term "entire surface" may denote the surface and i.e. a planar face of the electronic component, e.g. a lower face of the electronic component, which lower face is covered only partially with the adhesive structure. The remaining second part of the surface is free from the adhesive structure. This means that the second part is not in direct contact with the adhesive structure.

Covering only the first part of the surface of the electronic component with the adhesive structure results in an adhesive structure with a smaller covering area compared to conventional adhering techniques where the entire component surface is covered with adhesive material. This prevents the adhesive material from assuming a crater shaped form which leads to an undesired air filled gap between the adhesive structure and the electrical component. As mentioned above, high temperature and pressure may be applied in subsequent manufacturing steps, e.g. laminating the component carrier. While carrying out the lamination, the air filled gap may lead to pressure applied to the electronic component, to internal stress within the component carrier, to delamination of the component carrier or to damage of the electronic component. By covering only a first part of the surface of the electronic component with adhesive structure, the size of the air filled gap may be minimized which may lead to a robust component carrier which is less prone to delamination.

Covering the surface of the electronic component partially (i.e. only the first part) with adhesive structure and partially with the component carrier body i.e. the second part) may lead to an electronic device with an improved robustness, since undesired air gaps are avoided while the electronic component is secured from all sides. Covering the second part of the surface, i.e. the lower side, of the electronic component with resin takes place in the subsequent laminating step which may be performed anyway. Thus no additional manufacturing step is required.

In an embodiment, at least one edge section of the surface of the electronic component is free from adhesive structure. Specifically, the edge section forming the second part of the surface is covered by the component carrier body.

In particular, all of the edge sections (i.e. the second part) of the lower surface of the electronic component are free from the adhesive structure, while a substantially centered section (i.e. the first part) of the lower surface of the electronic component is covered with the adhesive structure. Hence, the first part of the surface is surrounded by the edge section.

Keeping at least one edge section of the electronic component free from the adhesive structure may provide the advantage that the forming of a so-called meniscus of adhesive material is avoided. In the context of the present application, the term "meniscus" may denote a small overlap of adhesive material beyond an edge of the electronic component. The meniscus may have the form of an inclined plane on which a further layer or structure might slip. For example, when arranging a precut prepreg layer on the electronic component, the meniscus may act like a small ramp over which the precut prepreg layer might slips, thereby impeding an exact alignment of the precut prepreg layer.

In the context of the present application, the term "precut prepreg layer" may denote a prepreg layer with cavities for accommodation of the electronic components therein.

Further, by avoiding the occurrence of menisci, adjacent electronic components can be placed closer to each other, thereby allowing an increased miniaturization of the electronic device.

Further, in the subsequent laminating step, the edges and corners which are free from adhesive structure are covered with the component carrier body, e.g. with resin, such that the electronic component is secured from all sides, thereby providing an electronic device with an improved stability and robustness.

In an embodiment, the adhesive structure is a layer with a substantially constant thickness. In an embodiment, this thickness may be in a range between 3 µm to 300 µm ($3 \times 10^{-6}$ m to $300 \times 10^{-6}$ m).

Providing such a thin layer of adhesive structure may provide the advantage, that a reduced amount of adhesive material may be required. This may be in particular advantageous, since the adhesive material includes small bubbles of air which may cause delamination of the component carrier. With reduced amount of adhesive material, the number of bubbles is reduced as well. Forming highly thin layers or structures is generally technically challenging, in particular when it is desired to obtain a thin layer of constant thickness. It has turned out that the adhesive structure with a thickness in a range between 3 µm to 300 µm can be easily manufactured by a partial application of a small amount of adhesive material. Due to the partial application, forces and pressure which occur during equipment of the electronic device with the electronic component can displace the small amount of partially applied adhesive material to form a constant thin layer with a thickness in the above mentioned range. Furthermore, reducing the amount of adhesive material is also advantageous from the viewpoint of moisture absorption. Moisture from the environment may diffuse into the adhesive material, thereby leading to delamination of the component carrier. It has turned out that by providing an electronic device with a reduced amount of adhesive material has a reduced risk of failing a Moisture Sensitivity Level (MSL) test.

Additionally, the adhesive structure with a constant thin size may have the advantage, that the required time for laser drilling may be reduced. Further, laser parameters may be standardized when the adhesive structure has a constant thickness, independent from the size of the electronic component.

Furthermore, a reduced amount of adhesive material reduces the risk of unwanted shifting of the electronic component caused by cross-linking of the adhesive molecules during the curing step.

In an embodiment, the adhesive structure comprises at least one via for electrically contacting (e.g. the surface of) the embedded electronic component with the electrically conductive layer. Advantageously, an aspect ratio of the thickness of the adhesive structure and a diameter of the at least one via may be in a range between $d = 1.2 \times h$ and $d = 1.6 \times h$. For example, it may be defined by $d = 1.4 \times h$. In this context, d is the diameter of the at least one via and h is the thickness of the adhesive structure. The thickness of the adhesive structure is measured between the surface of the electronic component and the electrically conductive layer, for example.

In particular, the via may be formed by mechanical drilling or by laser drilling. Subsequent, the via may be lined by galvanic copper plating for an electrical connection of the electronic component.

Providing an electronic device with such an aspect ratio may be particularly advantageous when a thin adhesive structure is used. As can be seen from the above formula, when the thickness h of the adhesive structure is small, the diameter d of the via can also be kept small. This enables improved registration tolerances and therefore facilitates the registration in manufacturing steps like e.g. laser drilling and embedding. Further, the aspect ratio allows for a secure and uniform galvanic copper plating of the via. When the thickness of the adhesive structure is small, the connection path can be kept short, which results in a reduced resistance of the connection path and in reduced capacitive and inductive influences.

In an embodiment, the adhesive structure comprises a plurality of adhesive sub-structures, in particular a plurality of adhesive pads, wherein the adhesive sub-structures are spatially separated from each other.

In particular the adhesive structure may comprise a plurality of adhesive pads. The adhesive pads may have a substantially circular shape. Alternatively, the adhesive sub-structures may have a substantially rectangular and/or square shape, respectively. They may be arranged to each other with defined distances. E.g. they may be arranged in an array like manner, for example forming a 3×3 array, i.e. an arrangement with 3 rows and 3 columns of adhesive pads.

Providing a plurality of adhesive sub-structures may provide the advantage that each of the sub-structures can have a relatively small area, thereby avoiding the air filled gap caused by the crater shape which occurs at a conventional adhesive structure with a larger size. Further, adhering the electronic component by a plurality of sub-structures may provide the advantage, that a component with a larger size can be reliably adhered with the same amount of adhesive material as a component with a smaller size, e.g. by using four adhesive sub-structures which are arranged below four corners of the electronic component. It is also possible to arrange the adhesive sub-structures in a manner which is optimized for the respective component size and weight. At the same time, each of the adhesive sub-structures can have a constant small thickness independent from the component size. Further, adhering the electronic component by a plurality of adhesive sub-structures may further provide the advantage, that the space between the sub-structures can be filled with a further material which improves the stability and robustness of the component carrier as a whole.

In an embodiment, the space between the adhesive sub-structures is filled with electrically insulating material, in particular with resin. The electrically insulating material may be part of the component carrier body which surrounds partially the electronic component.

It has turned out, that a component carrier with an embedded electronic component is much more durable and robust, if the electronic component is fixed to the electrically conductive layer by a plurality of adhesive sub-structures wherein the space between the sub-structures is filled with a further material, which may be a material which is different than that of the adhesive sub-structures. The adhesive sub-structures and the material between them may constitute a kind of composite structure made of at least two alternating different materials, in particular the adhesive material and the electrically insulating material from the component carrier body. As a result, a highly robust component carrier is provided. The filling of the space between the adhesive sub-structures does not require an additional manufacturing step, since it can be performed during the subsequent laminating step, where e.g. prepreg is laminated onto the electronic component. In particular, the laminating step may be a heat-pressing step, wherein heat and pressure are applied to the electronic device. By applying heat and pressure, resin from the prepreg is enabled to flow beyond the component, thereby filling the space between the adhesive sub-structures.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, the above mentioned prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board or embedded between structures of the PCB. They may be connected to the respective main surface by soldering.

In the context of the present application, the term "substrate" may particularly denote a small component carrier having substantially the same size as an electronic component to be mounted thereon.

In an embodiment, the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip.

However, all other electronic components may be embedded in the component carrier of the electronic device.

In an embodiment, the at least one electrically insulating structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

In an embodiment, the electrically conductive layer comprises at least one of the group consisting of copper, aluminum, and nickel. Although copper is usually preferred, other materials are possible as well.

In an embodiment, the component carrier is a laminate-type component carrier. In such an embodiment, the component carrier is a compound of multiple layer structures which are stacked and connected together by applying a pressing force, if desired accompanied by heat.

In an embodiment, the adhesive structure is electrically insulating. Thus, it may establish a dielectric spacer between the electrically conductive layer and the electronic component. This makes it possible to specifically and precisely contact the embedded electronic component by the formation of via holes in the adhesive structure, which via holes may be subsequently filled with electrically conductive material such as copper.

In an embodiment, "the surface" of the electronic component is one main surface of the electronic component, in particular a lower main surface of the electronic component (see FIG. 2). In particular, sidewalls of the electronic component and/or an opposing second main surface (for instance the upper main surface) of the electronic component may be free of the adhesive structure. For instance, the sidewalls and/or the second main surface may be covered by the component carrier body as well.

In an embodiment, the method step of applying the adhesive structure comprises applying a plurality of adhesive sub-structures, in particular a plurality of adhesive pads, which adhesive sub-structures are spatially separated from each other.

The adhesive sub-structures may be applied by printing, dispensing and/or injecting. The sub-structures may have a substantially rectangular and/or square shape, respectively. Although these shapes are preferred, they can also have any other shape. They may be arranged to each other with defined distances, e.g. in an array like manner, for example forming a 3×3 array, i.e. an arrangement with 3 rows and 3 columns of adhesive sub-structures.

In an embodiment, embedding the electronic component further comprises filling a space between the adhesive sub-structures with electrically insulating material of the electrically insulating structure of the component carrier body.

In particular, embedding the electronic component may be performed by laminating the electrically insulating material of the component carrier body onto the electronic component by applying heat and/or pressure. Further in particular, the component carrier body may be a prepreg sheet. When the component carrier body is laminated onto the electronic component, electrically insulating material, e.g. resin from the prepreg, may fill the space between the adhesive sub-structures. Thereby, the electrically insulating material from the component carrier body covers the remaining part of the surface of the electronic component, in particular the remaining part of the lower surface, which is not already covered with the adhesive structure. Thus, no additional manufacturing step has to be performed for filling the space, since the laminating step is performed anyway.

BRIEF DESCRIPTION OF THE DRAWINGS

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 2:
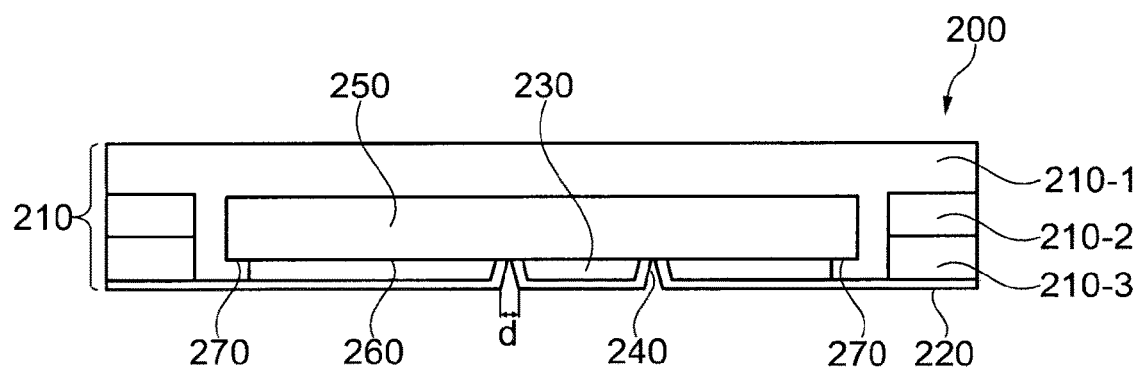
FIG. 2 shows a cross-sectional view of an electronic device according to an exemplary embodiment of the invention.

FIG. 2 shows an electronic device 200 according to an exemplary embodiment. The electronic device 200 comprises an electrically conductive layer 220, an electronic component 250 and an adhesive structure 230 which adheres the electronic component 250 to the electrically conductive layer 220. The electronic device 200 further comprises a component carrier body 210. The shown component carrier body 210 comprises further layers 210-1, 210-2, 210-3, which may be prepreg layers, although it is possible to provide a layer stack of (e.g. alternating) electrically insulating layers and electrically conductive layers, for example copper coated resin layers and/or copper coated prepreg layers. The number of the layers may be selected as desired for specific approaches. It is also possible to provide one single prepreg layer as component carrier body 210.

Figure 1:
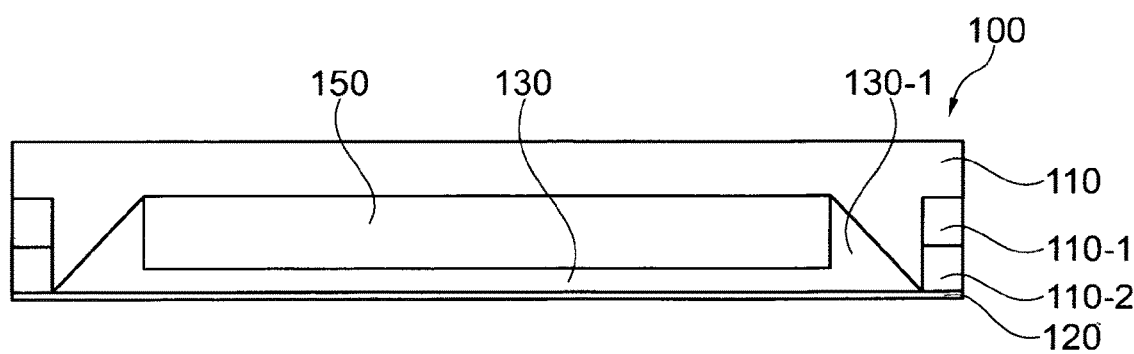
FIG. 1 shows a cross-sectional view of a conventional electronic device.

As can be seen, the electronic device 200 differs from that of FIG. 1 in that the adhesive structure 230 covers only a first part 260 of one surface of the electronic device 250. This said surface is the lower main surface of the electronic component 250 according to FIG. 2. The remaining second part 270 of the surface is covered with material of the component carrier body 210, e.g. with resin. In particular, in the shown embodiment, the remaining second part 270 of the electronic component 250 includes edge sections 270 of the electronic component 250. For example, at least one edge section 270 of the electronic component 250 is free from the adhesive structure 230 and covered with electrically insulating material 210-1 of the component carrier body 210. By keeping the edge sections free from adhesive structure, the formation of the meniscus 130-1 of FIG. 1, can be avoided. Thus, adjacent electronic components 250 can be placed closer together.

Furthermore, the adhesive structure 230 comprises vias 240 for electrically contacting the embedded electronic component 250 with the electrically conductive layer 220. Preferably, the aspect ratio of the via is d=1.4×h, where d is the diameter of the via 240 and h is the thickness of the adhesive structure 230.

Figure 3:
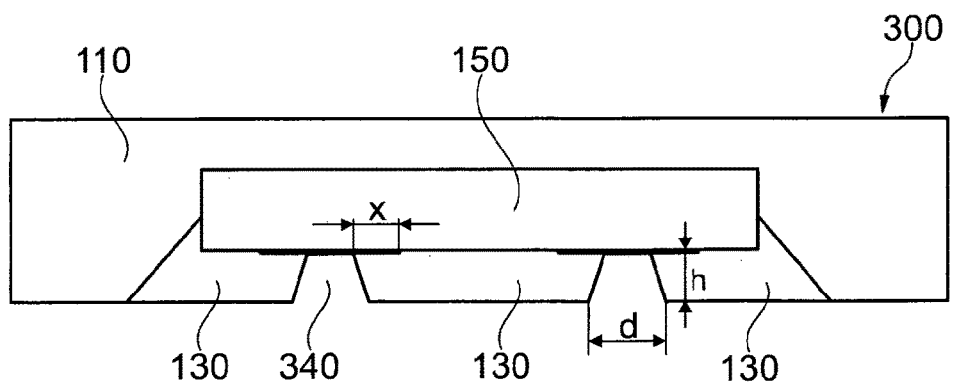
FIG. 3 shows a cross-sectional view of an electronic device with a conventional thick adhesive layer.

FIG. 3 shows for the better understanding of the invention a conventional electronic device 300 with a conventional thick adhesive layer 130. The lower surface and the lateral surfaces of the electronic component 150 are covered with the conventional thick adhesive layer 130. Conventional vias 340 are formed in the adhesive layer 130 for contacting the electronic component 150. If an aspect ratio of d=1.4×h is desired, where d is the diameter of the conventional via 340 and h is the thickness of the conventional adhesive layer 130, the conventional thick adhesive layer 130 necessitates a comparatively large diameter d, as becomes apparent from the above formula. A large via diameter permits only a small registration tolerance x.

As can be seen from the FIG. 2, by keeping the thickness of the adhesive structure 230 small, the diameter d of the via can also be kept small. In contrast to this, as can be taken from FIG. 3, a conventional adhesive layer 130 requires a larger via diameter d.

Figure 4A:
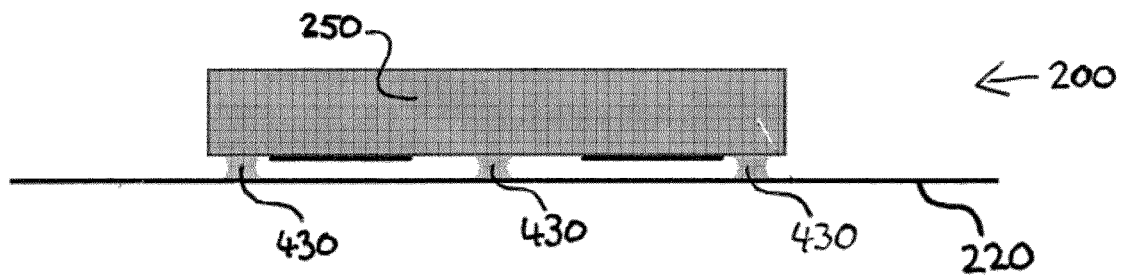
FIG. 4a shows a cross-sectional view of an intermediate product of the electronic device according to another embodiment of the invention.
Figure 4B:
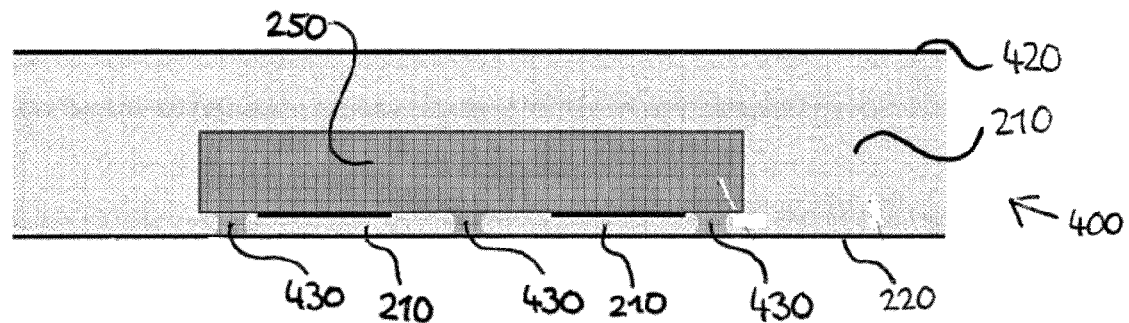
FIG. 4b shows the finished electronic device according to the exemplary embodiment.

FIG. 4a and FIG. 4b show the manufacturing process of an electronic device 200 according to an embodiment of the invention. As electrically conductive layer 220, a copper foil 220 with registration marks (not shown) is provided. Then, the adhesive structure 230 is arranged above the copper foil 220 using the registration marks for an exact alignment. In this embodiment, the adhesive structure comprises adhesive sub-structures 430 which are spatially separated from each other. As can be seen, the adhesive structure is thinner than that of FIG. 3.

The electronic component 250 is placed on the adhesive sub-structures 430 using the registration marks. FIG. 4a shows the resulting intermediate product state. In a subsequent manufacturing step, FR4 as component carrier body 210 is laminated on the electronic component 250, thereby filling the space between the adhesive sub-structures 430 with resin from the FR4 layer. A further copper foil 420 is subsequently laminated on the component carrier body 210. FIG. 4b shows the final electronic device 200 according to an exemplary embodiment.

Figure 5:
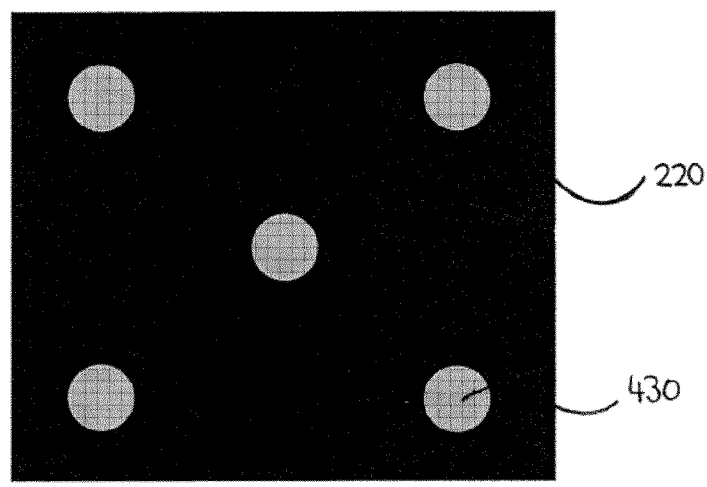
FIG. 5 shows a plan view of the adhesive sub-structures of the embodiment of FIGS. 4a and 4b.

FIG. 5 is a plan view of the adhesive sub-structures 430 according to the exemplary embodiment shown in FIGS. 4a and 4b. The adhesive structure 230 comprises five circular adhesive sub-structures 430 arranged on the copper foil 220.

FIG. 6a shows an electronic component 250 to be adhered to the electrically conductive layer. FIG. 6b to FIG. 6g show possible arrangements of adhesive sub-structures 430 according to an exemplary embodiment of the invention. In particular, FIG. 6b shows an arrangement of three rectangular adhesive sub-structures 430 arranged substantially parallel to each other. FIG. 6c shows an arrangement wherein the adhesive sub-structures are arranged as a 4×4 array of substantially square adhesive sub-structures 430. FIG. 6d shows a square adhesive substructure 230 with two rectangular cavities therein. FIG. 6e shows an arrangement of circular adhesive sub-structures 430 which are arranged like a 2×2 array with an additional circular sub-structure 430 in the center. It is also possible to arrange the adhesive sub-structures 430 e.g. as a 3×3 array (FIG. 6f) or a 2×2 array (FIG. 6g).

Figures 6, 7:
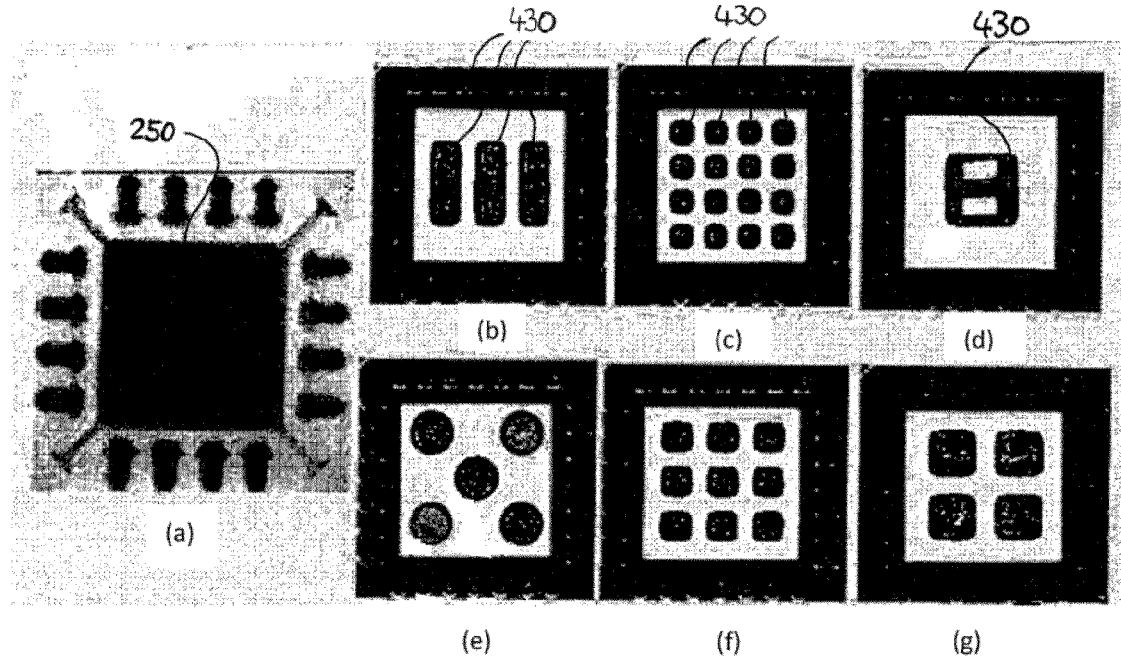
FIG. 6 shows arrangements of the adhesive structure according to an exemplary embodiment.
FIG. 7 shows a classification table for the Moisture Sensitivity Level Test.

FIG. 7 shows a classification table for the Moisture Sensitivity Level Test. As described above, in conventional electronic devices 100 with comparatively huge amount of adhesive, moisture diffuses from the environment into the adhesive material, thereby leading to a declined life duration and/or delamination in subsequent manufacturing steps. It has turned out that electronic devices according to an exemplary embodiment of the present invention achieve better results in MSL Testing due to the reduced amount of adhesive material.

Figure 8:
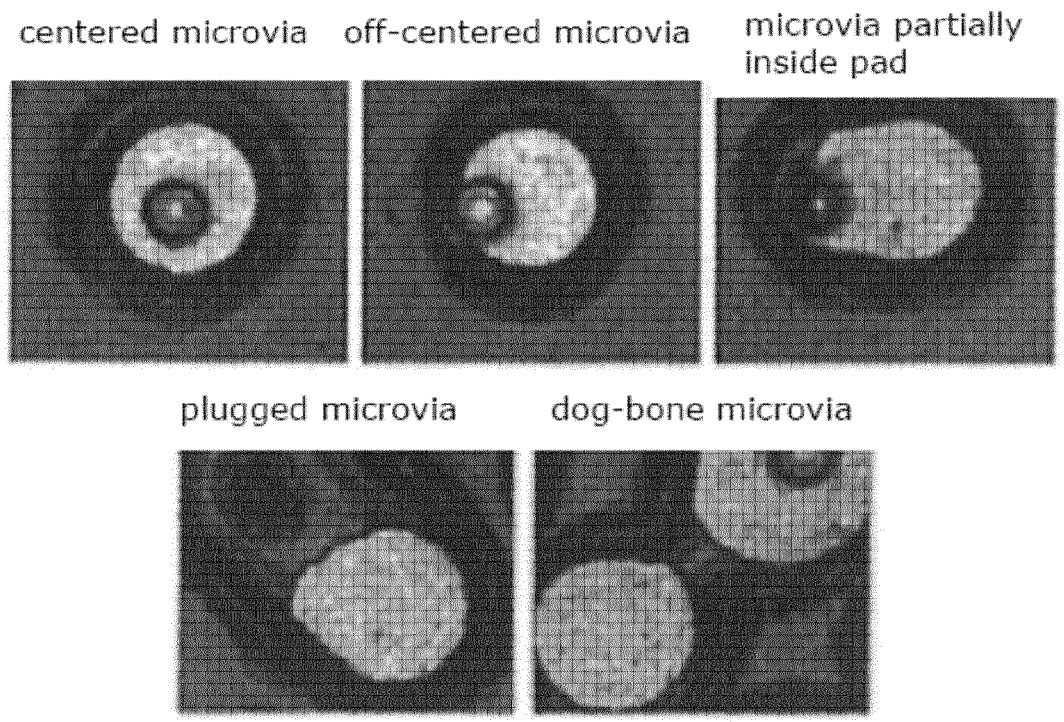
FIG. 8 shows different types of microvias.

FIG. 8 shows different types of vias employed in electronic devices 200 for electrical connection through the layers. As explained above, providing an adhesive structure 230 with a substantially constant thickness in a range between 3 μm to 300 μm ($3 \times 10^{-6}$ m to $300 \times 10^{-6}$ m) enables to keep the diameter of the vias through the adhesive structure 230 small. This applies for via types like centered microvias, off-centered microvias, microvias partially arranged inside a pad, plugged microvias, dog-bone microvias, partially filled microvias, completely filled microvias and for all further known types of vias. For a reliable electrical connection through the via, a homogenous distribution of filling material inside the via is important. It has turned out, that by providing the via with an aspect ratio of d=1.4×h (where d is the diameter of the via and h is the thickness of the adhesive structure), the deposition of material inside the via, for example copper, occurs homogenous and free of voids. Void formation is a growing problem in manufacturing of component carriers due to increase of miniaturization, since actually the occurrence of small voids may decrease the conduction of electrical signals through the via. Providing an electronic device with the mentioned aspect ratio prevents void formation and thus provides an improved signal integrity.

Figure 9:
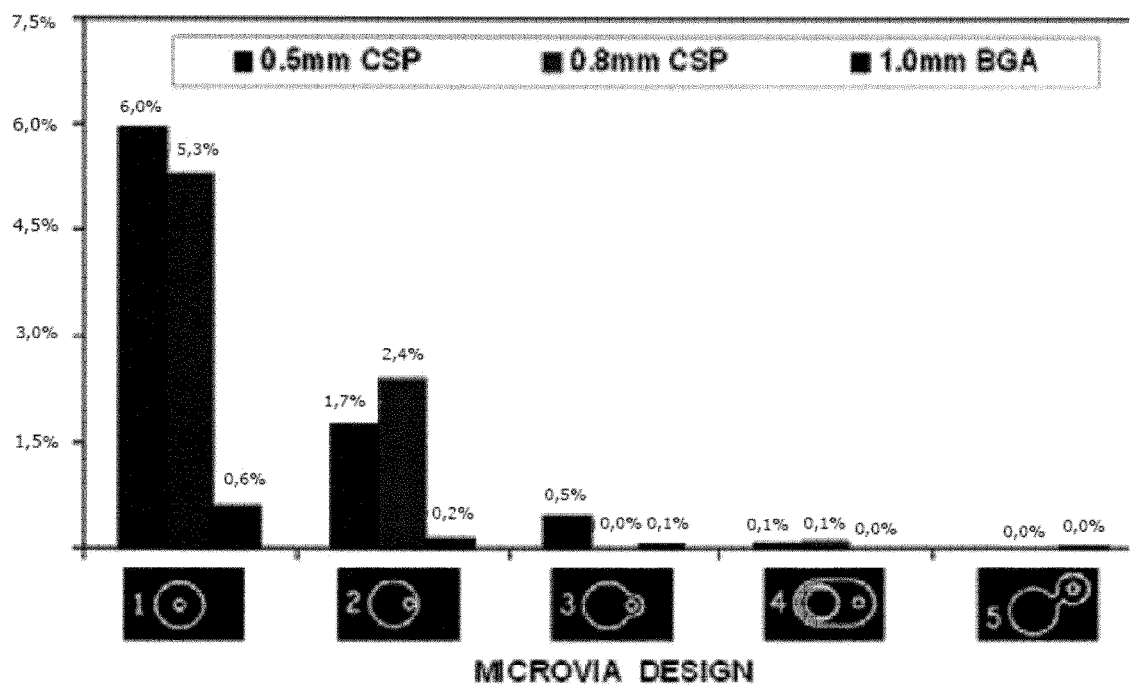
FIG. 9 shows a bar diagram representing the void formation reported for each of the microvia designs of FIG. 8.

FIG. 9 shows a bar diagram showing the void formation reported for each of the microvia designs of FIG. 8. The ordinate of the diagram represents the occurrence of voids in percent. Along the abscissa, the different microvia designs are represented, wherein respectively the left bar represent the voiding for a 0.5 mm Chip Scale Package (CSP), the center bar represents the voiding for a 0.8 mm CSP and the right bar represents the voiding for a 1.0 mm Ball Grid Array (BGA).

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

LIST OF REFERENCE SIGNS 100 conventional electronic device
110 conventional component carrier body
110-1, 110-2 conventional further layers of component carrier body
120 conventional electrically conductive layer
130 conventional adhesive structure
130-1 conventional meniscus
150 conventional electronic component
200 electronic device
210 component carrier body
210-1, 210-2, 210-3 further layers of component carrier body
220 electrically conductive layer
230 adhesive structure
240 via
250 electronic component
260 first part of the surface of the electronic component
270 remaining second part of the surface
300 conventional electronic device
340 conventional via
420 further copper foil
430 adhesive sub-structure

The invention claimed is:
1. An electronic device, comprising:
 a component carrier comprising a component carrier body, a substantially continuous electrically conductive layer, and an adhesive structure;
 an electronic component which is arranged within the component carrier body;
 wherein the adhesive structure is formed between a surface of the electronic component and the substantially continuous electrically conductive layer;
 wherein the adhesive structure covers a first part of the surface of the electronic component;
 wherein a remaining second part of the surface of the electronic component is covered with the component carrier body; and
 wherein all of the edge sections of the surface of the electronic component are free from the adhesive structure.

2. The electronic device according to claim 1, wherein the adhesive structure is a layer with a substantially constant thickness.

3. The electronic device according to claim 2, wherein the substantially constant thickness is in a range between 3 μm to 300 μm.

4. The electronic device according to claim 1, wherein the adhesive structure comprises at least one via for electrically contacting the embedded electronic component with the electrically conductive layer.

5. The electronic device according to claim 4, wherein an aspect ratio of the thickness of the adhesive structure and a diameter of the at least one via is in a range between $d=1.2\times h$ and $d=1.6\times h$ where d is the diameter of the at least one via and h is the thickness of the adhesive structure.

6. The electronic device according to claim 1, wherein the adhesive structure comprises a plurality of adhesive sub-structures,
 wherein the adhesive sub-structures are spatially separated from each other.

7. The electronic device according to claim 6, wherein a space between the adhesive sub-structures is filled with electrically insulating material.

8. The electronic device according to claim 1, wherein the component carrier is configured as one of the group consisting of a printed circuit board, and a substrate.

9. The electronic device according to claim 1, wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip.

10. The electronic device according to claim 1, wherein the component carrier body comprises at least one electrically insulating structure which comprises at least one of the group consisting of resin, cyanate ester, glass, glass fibers, prepreg material, polyimide, liquid crystal polymer, epoxy-based Build-Up Film, FR4 material, a ceramic, and a metal oxide.

11. The electronic device according to claim 1, wherein the substantially continuous electrically conductive layer comprises at least one of the group consisting of copper, aluminum, and nickel.

12. The electronic device according to claim 1, wherein the component carrier is a laminate-type component carrier.

13. The electronic device according to claim 1, wherein the adhesive structure is electrically insulating.

14. The electronic device according to claim 1, wherein the said surface of the electronic component is equal to one main surface of the electronic component.

15. A method of manufacturing an electronic device, the method comprising:
 providing a component carrier comprising a component carrier body, a substantially continuous electrically conductive layer and an adhesive layer;
 applying the adhesive structure on the substantially continuous electrically conductive layer;
 equipping the component carrier with an electronic component by placing the electronic component on the adhesive structure, such that the adhesive structure covers a first part of the surface of the electronic component and such that all of the edge sections of the surface of the electronic component are free from the adhesive structure;

embedding the electronic component within the component carrier body by laminating an electrically insulating structure of the component carrier body onto the electronic component, such that a remaining second part of the surface of the electronic component is covered with the electrically insulating structure of the component carrier body.

16. The method according to claim 15, wherein applying the adhesive structure comprises applying a plurality of adhesive sub-structures spatially separated from each other.

17. The method according to claim 15, wherein embedding the electronic component further comprises filling a space between the adhesive sub-structures with electrically insulating material of the electrically insulating structure of the component carrier body.

* * * * *